United States Patent [19]

Nakayama

[11] Patent Number: 5,761,232
[45] Date of Patent: Jun. 2, 1998

[54] DOUBLE HETEROJUNCTION SEMICONDUCTOR LASER HAVING IMPROVED LIGHT CONFINEMENT

[75] Inventor: Takeshi Nakayama, Hyogo, Japan

[73] Assignee: Mitsubishi Denki Kabushiki Kaisha, Tokyo, Japan

[21] Appl. No.: 596,413

[22] Filed: Feb. 2, 1996

[30]     Foreign Application Priority Data

Apr. 28, 1995  [JP]  Japan ..................... 7-106684

[51] Int. Cl.⁶ ........................................... H01S 3/19
[52] U.S. Cl. ............................................. 372/46
[58] Field of Search ........................... 372/45, 46

[56]          References Cited

U.S. PATENT DOCUMENTS 5,272,712  12/1993  Arimoto et al. ..................... 372/45
5,619,518   4/1997  Horie et al. ....................... 372/45

FOREIGN PATENT DOCUMENTS 61-220488  9/1986  Japan .
63-5588    1/1988  Japan .

Primary Examiner—James W. Davie
Attorney, Agent, or Firm—Leydig, Voit & Mayer, Ltd.

[57]           ABSTRACT

A double heterojunction semiconductor laser includes a semiconductor substrate of a first semiconductor material having a first conductivity type; successively disposed on the semiconductor substrate, a first cladding layer of the first conductivity type, an active layer, and a second cladding layer of a second conductivity type, opposite the first conductivity type, the second cladding layer having a central ridge including side surfaces and a top surface; a current blocking layer of the first conductivity type disposed on the second cladding layer and contacting the side surfaces of the ridge; a second conductivity type contact layer of the first semiconductor material disposed on the top surface of the ridge and on the current blocking layer; and first and second electrodes contacting the semiconductor substrate and the contact layer, respectively, wherein at least one of the first and second cladding layers is a superlattice layer including a plurality of alternating layers of different compositions, the superlattice layer lattice matching with the first semiconductor material.

6 Claims, 6 Drawing Sheets

THE DIRECTION
OF A RESONATOR

FIG. 9A
PRIOR ART
FIG. 9B
PRIOR ART
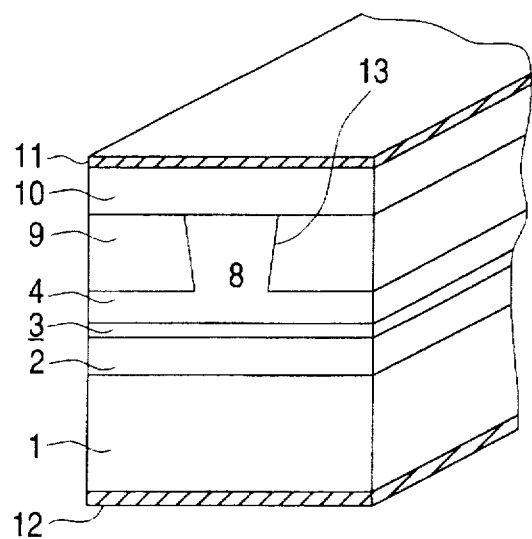
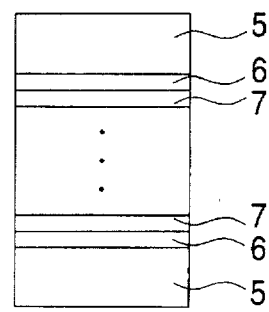
FIG. 10
PRIOR ART
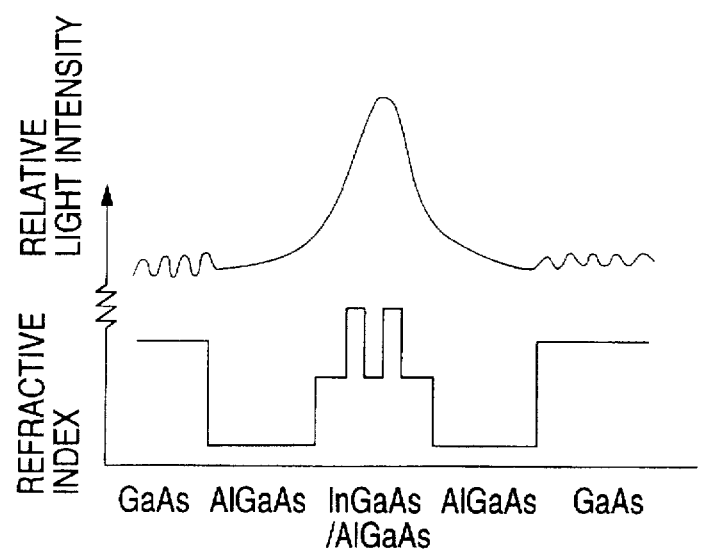

DOUBLE HETEROJUNCTION SEMICONDUCTOR LASER HAVING IMPROVED LIGHT CONFINEMENT

BACKGROUND OF THE INVENTION

The present invention relates to a double heterojunction semiconductor laser and, more particularly, to a semiconductor laser in which light confinement is improved to reduce divergence of the laser light beam produced by the laser.

FIG. 9A is a partial perspective view of a double heterojunction semiconductor laser according to the prior art. The semiconductor laser includes an n-type GaAs substrate 1 on which are successively disposed an n-type $Al_{0.5}Ga_{0.5}As$ cladding layer 2, an active layer 3, and a p-type $Al_{0.5}Ga_{0.5}As$ cladding layer 4. The active layer 3 has a multiple quantum well (MQW) structure, shown in detail in FIG. 9B. The MQW layer 3 includes, alternatingly laminated, InGaAs well layers 6 and $Al_{0.2}Ga_{0.8}As$ barrier layers 7. The outside layers of the active layer 3 are InGaAs barrier layers. These laminated layers 6 and 7 are, in turn, sandwiched between a pair of AlGaAs guide layers 5.

In the course of manufacturing the semiconductor laser of FIG. 9A, after the growth of the cladding layers and the active layer, preferably by metal organic chemical vapor deposition (MOCVD), the cladding layer 4 is masked and etched to form a ridge 8 extending in the resonator length direction of the semiconductor laser and having a top surface with a width of about 2 microns and oblique side surfaces. Subsequently, in another MOCVD step, an n-type $Al_{0.7}Ga_{0.3}As$ layer 9 is grown on the cladding layer 4 next to and on both sides of the ridge 8, contacting side surfaces of the ridge, as a current blocking layer. A p-type GaAs contact layer 10 is subsequently grown on the top surface of the ridge 8 and on the current blocking layer 9. The laser is completed by forming electrodes 11 and 12 on the contact layer 10 and the substrate 1, respectively. Because of the pn junction formed between the cladding layer 4 and the current blocking layer 9, current flow between the electrodes 11 and 12 is concentrated in the ridge 8. The current concentration ensures laser oscillation of the semiconductor laser at a relatively low voltage by producing a current density that exceeds the threshold current density required for laser oscillation.

The lower half of FIG. 10 is a graph of the refractive index of the semiconductor laser structure of FIG. 9A taken along an imaginary line passing through the center of the laser of FIG. 9A perpendicular to the electrodes 11 and 12. The relative distance along that line is plotted on the abscissa of FIG. 10. As shown in that graph, the refractive index of the cladding layers 2 and 4 is smaller than that of the active layer 3 so that light is generally confined to the active layer 3 by the cladding layers. The cladding layers 2 and 4 separate the active layer 3 from GaAs, i.e., the substrate 1 and the contact layer 10. Although the cladding layers 2 and 4 significantly confine light to the active layer 3, there is still some light leakage to the substrate and the contact layer.

The light generated within the laser propagates through the layers of the laser producing a light distribution along the same direction of the graph of refractive index, as indicated in the upper half of FIG. 10. There, relative light intensity as a function of position is plotted. Although most light is confined to the active layer 3, some light reaches the substrate 1 and the contact layer 10. The relatively small amplitude variations in light intensity shown in the substrate 1 and the contact layer 10 result from light leakage into and resonance in those GaAs elements. The light leakage increases the divergence of the laser beam produced by the laser in the far field pattern in a plane transverse to the plane of the active layer 3 of the semiconductor laser. Therefore, it is desirable to prevent light leakage and/or resonance in the semiconductor laser perpendicular to the layers in order to avoid undue divergence of the light beam produced by the laser.

In order to reduce light leakage into the substrate and contact layers, the thickness of the ridge 8, of the other portions of the cladding layer 4, and of the cladding layer 2 might be increased. Although the increased thicknesses of the layers increase light attenuation, reducing light leakage, several problems result from increasing the thicknesses of the cladding layers. For example, if the height of the $Al_{0.5}Ga_{0.5}As$ ridge 8 is too large, the crystalline lattice mismatches between the cladding layer 4 and the $Al_{0.7}Ga_{0.3}As$ current blocking layer 9 and between the current blocking layer and the contact layer 10 adversely affect the crystallinity of those layers. The lattice mismatch can be accommodated if the dimensions of the mismatched layers are limited but not if those dimensions are too long. The same limitation applies to the thickness of the cladding layer 2 which has a different lattice constant from the GaAs substrate 1. Poor crystallinity resulting from lattice constant mismatches that are not accommodated by the semiconductor materials adversely affect the electrical and optical characteristics of the semiconductor laser.

SUMMARY OF THE INVENTION

An object of the invention is to provide a double heterojunction semiconductor laser having reduced light leakage through the cladding layers into a substrate and a contact layer.

Another object of the invention is to provide a double heterojunction semiconductor laser preventing resonance of light that leaks through the cladding layers transverse to those layers.

According to one aspect of the invention, a double heterojunction semiconductor laser includes a semiconductor substrate of a first semiconductor material having a first conductivity type; successively disposed on the semiconductor substrate, a first cladding layer of the first conductivity type, an active layer, and a second cladding layer of a second conductivity type, opposite the first conductivity type, the second cladding layer having a central ridge including side surfaces and a top surface; a current blocking layer of the first conductivity type disposed on the second cladding layer and contacting the side surfaces of the ridge; a second conductivity type contact layer of the first semiconductor material disposed on the top surface of the ridge and on the current blocking layer; and first and second electrodes contacting the semiconductor substrate and the contact layer, respectively, wherein at least one of the first and second cladding layers is a superlattice layer including a plurality of alternating layers of different compositions, the superlattice layer lattice matching with the first semiconductor material. In this semiconductor laser, the cladding layers are increased in thickness to attenuate light without adversely affecting crystallinity by using a superlattice structure as at least one of the cladding layers to achieve a lattice constant match between different semiconductor materials.

According to a second aspect of the invention, a double heterojunction semiconductor laser includes a semiconductor substrate having a first conductivity type; successively disposed on the semiconductor substrate, a first cladding layer of the first conductivity type, an active layer, and a second cladding layer of a second conductivity type, opposite the first conductivity type, the second cladding layer having a central ridge including side surfaces and a top surface; a current blocking layer of the first conductivity type disposed on the second cladding layer and contacting the side surfaces of the ridge; a second conductivity type contact layer disposed on the top surface of the ridge and on the current blocking layer; and first and second electrodes contacting the semiconductor substrate and the contact layer, respectively, wherein the contact layer includes a central recess opposite the ridge. The recess, alone or in combination with the second electrode, allows light to escape to avoid the effects of light resonating in the contact layer.

According to a third aspect of the invention, a double heterojunction semiconductor laser includes a semiconductor substrate having a first conductivity type; successively disposed on the semiconductor substrate, a first cladding layer of the first conductivity type, an active layer, and a second cladding layer of a second conductivity type, opposite the first conductivity type, the second cladding layer having a central ridge including side surfaces and a top surface; a current blocking layer of the first conductivity type disposed on the second cladding layer and contacting the side surfaces of the ridge; a second conductivity type contact layer disposed on the top surface of the ridge and on the current blocking layer; and first and second electrodes contacting the semiconductor substrate and the contact layer, respectively, wherein the substrate includes a central recess opposite the ridge, exposing the first cladding layer, and including a metal filling the central recess in the substrate and extending from the first cladding layer to the first electrode. The metal filling the opening in the substrate prevents light leakage and improves the heat dissipation of the semiconductor laser.

Other objects and advantages of the present invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

FIG. 9A is a partial perspective view of a conventional semiconductor laser.

FIG. 9B shows, in detail, the structure of the active layer of the semiconductor laser of FIG. 9A.

FIG. 10 is a graph illustrating the distribution of refractive index and light leakage within the semiconductor laser of FIG. 9A.

In all figures, like elements are given the same reference numbers.

DETAILED DESCRIPTION OF THE PREFERRED EMBODIMENTS

Figure 1A:
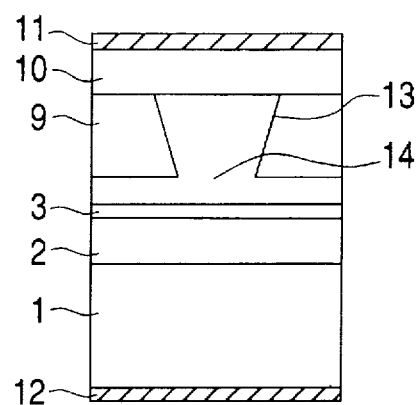
FIG. 1A is an end view of a semiconductor laser according to an embodiment of the invention.
Figure 1B:
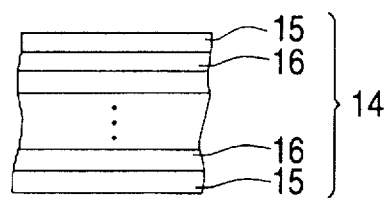
FIG. 1B is a detail view showing the structure of the upper cladding layer of the semiconductor laser of FIG. 1A.

FIG. 1A is an end view of a semiconductor laser according to an embodiment of the invention. That semiconductor laser includes a GaAs substrate 1, an n-type $Al_{0.5}Ga_{0.5}As$ cladding layer 2, an active layer 3, and a cladding layer 14, those layers all being sequentially disposed on the GaAs substrate 1. The active layer 3 may be an MQW structure. The cladding layer 14, as illustrated in FIG. 1B, has a superlattice structure including a plurality of alternating p-type AlGaAs layers 15, each of which has a lattice constant larger than the lattice constant of GaAs, and n-type InGaAsP layers 16, each InGaAsP layer having a lattice constant smaller than the lattice constant of GaAs. The alternating layers apply stresses to each other in alternating directions and, as well known in the art, produce an effective lattice constant different from the lattice constant of either material. The effective lattice constant makes an improved lattice constant match with another material. In this example, the lattice match to GaAs is improved, GaAs having a lattice constant intermediate the lattice constants of AlGaAs and InGaAsP.

If the Al composition of the AlGaAs layer 15 of the cladding layer 14 is 0.48, in order to achieve a desired degree of internal stress, it is desirable that the composition of the $In_{1-x}Ga_xAs_yP_{1-y}$ layers 16 have x=0.54 and y=0.03. In this instance, the layer 15 is subjected to a compressive distortion of about 0.07 percent relative to GaAs and the p-type InGaAsP layer 16 is subjected to a tensile distortion of about 0.07 percent relative to GaAs. Assuming that the layers 15 and 16 have respective thicknesses of about 10 nanometers (nm), a superlattice structure including one hundred pairs of the layers 15 and 16 produces a cladding layer 14 having a thickness of about 2 micrometers. This thickness is sufficient to attenuate the laser light significantly and prevent light leakage into the contact layer 10. However, because of the effect of the lattice match with GaAs, the crystallinity of the current blocking layer 9 and the contact layer 10 is good and does not adversely affect the optical or electrical characteristics of the semiconductor laser.

Figure 2A:
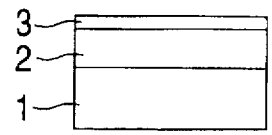
FIGS. 2A–2E illustrate steps in a method of manufacturing a semiconductor laser according to an embodiment of the invention.
Figure 2B:
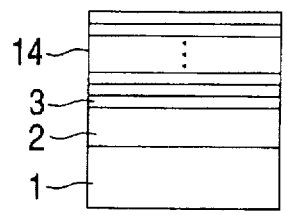
Figure 2C:
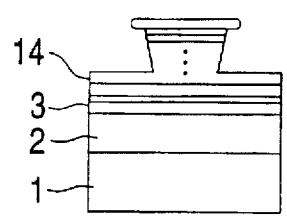
Figure 2D:
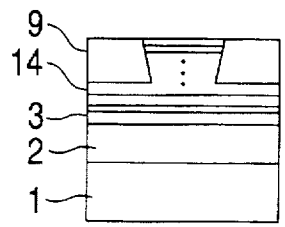
Figure 2E:
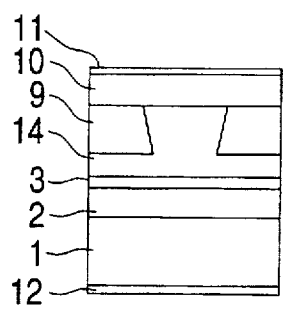

FIGS. 2A–2E illustrate steps in a method of manufacturing the semiconductor laser of FIG. 1A. Initially, after MOCVD growth of the first cladding layer 2 and the active layer 3 as in the conventional semiconductor laser, the superlattice cladding layer 14, including alternating layers of p-type $Al_{0.48}Ga_{0.52}As$ and p-type $In_{0.46}Ga_{0.54}As_{0.03}P_{0.97}$, is grown. The ridge is produced by masking and etching. These steps are indicated sequentially in FIGS. 2B and 2C in which the etching mask for producing the ridge is clearly shown. The current blocking layer 9 of n-type $Al_{0.7}Ga_{0.3}As$ is grown to be in contact with the side surfaces of the ridge and even with the top surface of the ridge, as shown in FIG. 2D, for example, by MOCVD without previously removing the etching mask used to form the ridge. The contact layer 10 is grown and the electrodes 11 and 12 are formed to produce the structure of FIGS. 2E and 1A. By controlling the composition of the superlattice layers in the cladding layer 14, a lattice constant match or a near lattice constant match can be achieved between the GaAs contact layer 10 and the cladding layer 14, thereby avoiding dislocations and other adverse effects of lattice mismatching on the crystallinity of the layers.

In addition to the superlattice structure of the cladding layer 14, the cladding layer 2 may also have a superlattice structure of alternating layers of n-type AlGaAs and InGaAsP that have different compositions but that, together, make a lattice match with the GaAs substrate 1. In this embodiment of the invention, since the cladding layers are both lattice matched with GaAs, much larger thickness cladding layers can be employed in the semiconductor laser than in the conventional semiconductor laser of FIG. 9A. The increased thicknesses of the cladding layers prevent the leakage of light into the substrate 1 and the contact layer 10. In addition, since there are no significant lattice mismatches, crystalline damage to the materials is minimized and good optical and electrical characteristics of the semiconductor laser are achieved. Further, because of the prevention of light leakage into one or both of the contact layer and the substrate, the divergence of the far field pattern of the light beam produced by the laser is reduced.

Although, in this embodiment, crystalline lattice matching is achieved with at least one superlattice structure including alternating layers of AlGaAs and InGaAsP, other combinations of compound semiconductor materials can be employed in the layers of the superlattices to achieve lattice constant matching. Likewise, the conductivity types of the respective layers can all be reversed in this and all other described embodiments of the semiconductor laser.

Figure 3:
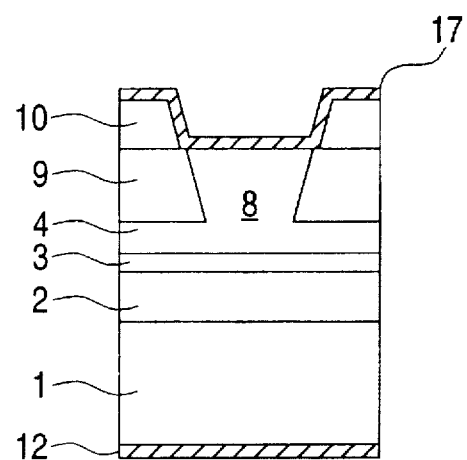
FIG. 3 is an end view of a semiconductor laser according to another embodiment of the invention.

FIG. 3 is an end view of a semiconductor laser according to another embodiment of the present invention. In this semiconductor laser embodiment, the contact layer 10 is present on and directly contacts only the current blocking layer 9. There is no direct contact between that contact layer 10 and the top surface of the ridge 8. Instead, an electrode 17, replacing the electrode 11 of the conventional structure of FIG. 9A, directly contacts not only the contact layer 10 but also the ridge 8 at the interface between the current blocking layer 9 and the contact layer 10.

Since, in this embodiment, part of the contact layer 10 of the embodiment of FIG. 1A is missing, the leakage of light into the contact layer is minimized or eliminated. However, if the removed portion of the contact layer is too narrow, the mode of oscillation of the semiconductor laser can become unstable. To avoid that instability, the width of the removed part of the contact layer 10 should be about 2 micrometers, approximately the width of the ridge 8 at the interface with the contact layer 10. In any event, the removal of a portion of the contact layer 10 and the direct contact of the electrode 17 with the ridge 8 limit or prevent light leakage and thereby reduce the divergence of the light beam produced by the semiconductor laser.

Figure 4:
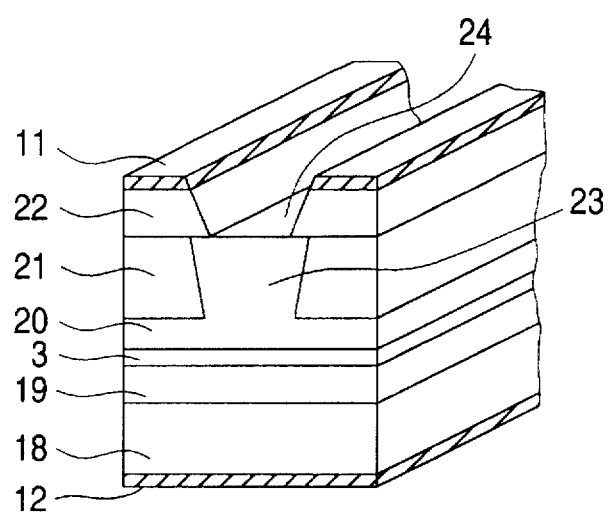
FIG. 4 is a partial perspective view of a semiconductor laser according to still another embodiment of the invention.

FIG. 4 is a perspective view of still another semiconductor laser according to the invention. The semiconductor laser of FIG. 4 includes a p-type GaAs substrate 18, a p-type AlGaAs cladding layer 19, an n-type AlGaAs cladding layer 20, a p-type $Al_{0.3}Ga_{0.7}As$ current blocking layer 21, and an n-type GaAs contact layer 22. In the semiconductor laser embodiment of FIG. 4, part of the contact layer 22 that directly contacts the top surface of a ridge 23 of the cladding layer 20 is removed to form a window 24. However, narrow regions of the contact layer 22 remain in contact with the top surface of the ridge 23 of the cladding layer 20 along edges of that ridge. In this embodiment, a p-type GaAs substrate is preferably used because the area of contact between the contact layer 22 and the cladding layer 20 is relatively small, increasing the difficulty of achieving a current density in the central part of the active layer 3 that exceeds the laser oscillation threshold current density of the laser. In order to overcome this difficulty, it is desired that the ridge be made of an n-type material, such as AlGaAs, which has a smaller resistivity than the p-type AlGaAs cladding layer 4 of the conventional semiconductor laser of FIG. 9A.

The semiconductor laser of FIG. 4 is constructed by successively growing on the substrate 18, preferably by MOCVD, the cladding layer 19, the active layer 3, and the cladding layer 20. After masking and etching to form the ridge 23, the current blocking layer 21 and the contact layer 22 are successively grown as in the processes previously described. Thereafter, part of the contact layer 22 is removed by selective etching to produce the window 24. The window 24 has a width of about 1.5 micrometers when the ridge 23 has a top surface width of about 2 micrometers. As shown in FIG. 4, the electrode 11 is present only on the contact layer 22 and does not extend into the window 24 nor contact the ridge 23.

In this embodiment of the invention, any light leaking from the cladding layer 20 is radiated through the window 24. Thus, instead of achieving reduced light leakage to a GaAs layer to avoid broadening of the laser light beam, in this embodiment, light is intentionally permitted to escape to avoid the resonance of the light in the contact layer, as shown at the ends of the light distribution in the upper part of FIG. 10.

Figure 5:
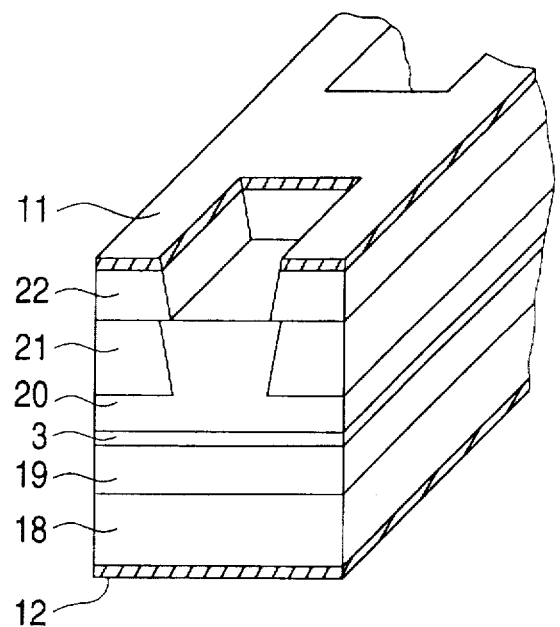
FIG. 5 is a partial perspective view of a semiconductor laser according to yet another embodiment of the invention.

In the embodiments of FIGS. 3 and 4, parts of the contact layers 10 and 22 are removed to produce windows extending along the entire length of the optical resonator of the semiconductor laser, i.e., from facet to facet. A different embodiment is illustrated in FIG. 5 in which the window in the contact layer 22 does not extend without interruption between the two facets of the semiconductor laser. Instead, a portion of the contact layer transverse to the resonator direction of the semiconductor laser is left in place. Thus, in plan view, the contact layer 22 and the electrode 11 have the shape of the letter H. This arrangement produces an improved ohmic contact between the contact layer 22 and the adjacent cladding layer including the ridge.

Figure 6:
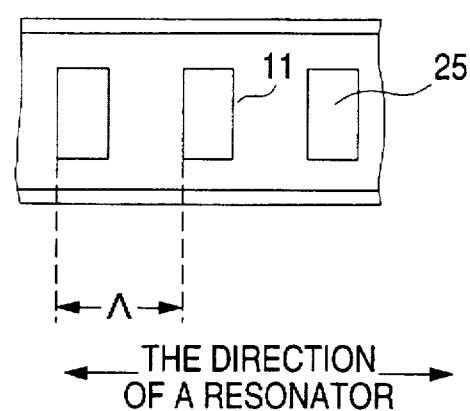
FIG. 6 is a plan view showing a window structure of a semiconductor laser according to an embodiment of the invention.

Still another embodiment of the invention, a further variation of the embodiment of FIG. 5, is shown in a plan view in FIG. 6. In that embodiment of FIG. 6, instead of including two windows separated by a part of the contact layer 22, as in the embodiment of FIG. 5, the semiconductor laser includes a plurality of windows 25 extending through the contact layer 22 to expose parts of the cladding layer including the ridge. The windows 25 are periodically arranged with a period $\Lambda$. The period $\Lambda$ shown in FIG. 6 is preferably equal to $\lambda/2n$ where $\lambda$ is the wavelength of light produced by the semiconductor laser and n is the refractive index of the waveguide of the semiconductor laser. This particular periodic arrangement results in diffraction of the light produced by the semiconductor laser, aiding in the stabilization of the longitudinal mode.

In some conventional semiconductor lasers, a guide layer is grown on the active layer 3 and etched in a particular pattern to produce a periodic structure. Thereafter, a cladding layer is grown on the etched guide layer including a periodic structure. In the embodiment of the invention illustrated in FIG. 6, the diffraction grating, i.e., periodic structure, has an electrode disposed directly on it so that the longitudinal mode of oscillation of the semiconductor laser is stable and the diffraction grating is easily produced.

Figure 7:
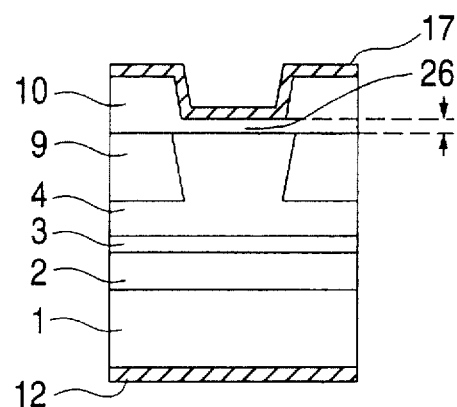
FIG. 7 is an end view of a semiconductor laser according to a further embodiment of the invention.
Figure 8:
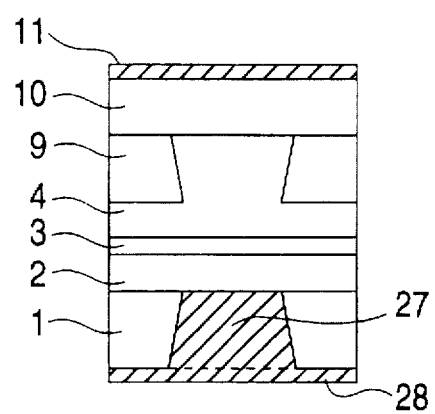
FIG. 8 is an end view of a semiconductor laser according to another embodiment of the invention.

FIG. 7 is an end view of still another embodiment of the semiconductor laser according to the invention that is similar to the semiconductor laser of FIG. 3. In the embodiment of FIG. 7, the contact layer 10 between the electrode 17 and the ridge 8 is not entirely removed so that the electrode 17 does not directly contact the top surface of the ridge 8. Instead, a thin layer 26 of the GaAs contact layer 10 is interposed between the ridge 8 and the electrode 17 and has a thickness of about 10 nm. This thickness should be substantially less than a wavelength of light produced by the laser to avoid resonance. Not only is this embodiment of the invention effective in suppressing divergence of the laser light beam but also a good ohmic contact to the ridge 8 of the cladding layer 4 is achieved because of the presence of the thin portion 26 of the GaAs contact layer 10 between the electrode and the ridge. FIG. 8 is an end view of yet another semiconductor laser according to an embodiment of the invention. In this embodiment, a portion of the GaAs substrate 1 opposite the ridge 8 is removed so that part of the cladding layer 2 is exposed opposite the ridge. A metal 27 is deposited on the exposed part of the cladding layer filling the opening in the substrate 1 as a plated heat sink (PHS). The plated metal may extend to the portions of the substrate 1 that are not part of the opening and extend transversely as an electrode 28, as shown in FIG. 8.

Since the metal, typically gold, of the PHS does not support the propagation of light as the GaAs substrate 1 does, the PHS is effective in eliminating light leakage into the substrate and thereby reducing the far field divergence of the laser light beam. Although the PHS is shown as part of a particular semiconductor laser structure in FIG. 8, that PHS can be used in any of the other embodiments of the invention described above to provide additional control of the divergence of the laser light beam, supplementing the divergence limitation provided by other features of those other embodiments, as well as improved heat dissipation.

What is claimed is:

1. A double heterojunction semiconductor laser comprising:

a semiconductor substrate of a first semiconductor material having a first conductivity type;

successively disposed on the semiconductor substrate, a first cladding layer of the first conductivity type, an active layer, and a second cladding layer of a second conductivity type, opposite the first conductivity type, the second cladding layer having a central ridge including side surfaces and a top surface;

a current blocking layer of the first conductivity type disposed on the second cladding layer and contacting the side surfaces of the ridge;

a second conductivity type contact layer of the first semiconductor material disposed on the top surface of the ridge and on the current blocking layer; and first and second electrodes contacting the semiconductor substrate and the contact layer, respectively, wherein the second cladding layer is a superlattice layer including a plurality of alternating layers of different compositions, the superlattice layer having sufficient thickness to prevent light generated in the active layer from leaking to the contact layer and an effective lattice constant lattice matching with the first semiconductor material whereby the second cladding layer prevents light leakage without adversely affecting crystallinity of the contact layer.

2. The double heterojunction semiconductor laser of claim 1, wherein the first semiconductor material is GaAs and the superlattice layer includes alternating layers of AlGaAs and InGaAsP.

3. The double heterojunction semiconductor laser of claim 1, wherein the active layer includes a multiple quantum well structure including alternating layer of InGaAs and AlGaAs.

4. The double heterojunction semiconductor laser of claim 1, wherein the first cladding layer is about 2 microns thick.

5. The double heterojunction semiconductor laser of claim 1, wherein the first cladding layer is a second superlattice layer including a plurality of alternating layers of different compositions, and the second superlattice layer has an effective lattice constant lattice matching with the first semiconductor material.

6. The double heterojunction semiconductor laser of claim 2, wherein the AlGaAs layer of the superlattice layer has an aluminum composition of approximately 0.48 and the InGaAsP layer of the superlattice layer has a gallium composition of about 0.54 and an arsenic composition of about 0.03.

* * * * *